(12) United States Patent
Seguin

(10) Patent No.: US 8,111,842 B2
(45) Date of Patent: Feb. 7, 2012

(54) FILTER ADAPTATION BASED ON VOLUME SETTING FOR CERTIFICATION ENHANCEMENT IN A HANDHELD WIRELESS COMMUNICATIONS DEVICE

(75) Inventor: Chad G. Seguin, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 587 days.

(21) Appl. No.: 12/357,119

(22) Filed: Jan. 21, 2009

(65) Prior Publication Data

US 2009/0252350 A1 Oct. 8, 2009

Related U.S. Application Data

(60) Provisional application No. 61/042,622, filed on Apr. 4, 2008.

(51) Int. Cl.
*H03G 3/00* (2006.01)
(52) U.S. Cl. ......... 381/109; 381/102; 381/104; 455/567
(58) Field of Classification Search .................. 381/102, 381/104, 109; 455/567
See application file for complete search history.

(56) References Cited

U.S. PATENT DOCUMENTS

| | | | |
|---|---|---|---|
| 5,335,277 A | * | 8/1994 | Harvey et al. ................. 380/242 |
| 7,280,958 B2 | | 10/2007 | Pavlov et al. |
| 2007/0253578 A1 | * | 11/2007 | Verdecanna et al. .......... 381/104 |
| 2010/0080379 A1 | * | 4/2010 | Chen et al. ............... 379/390.01 |

FOREIGN PATENT DOCUMENTS

WO WO-9738488 10/1997

OTHER PUBLICATIONS

Dr. -Ing, et al., "ITU-T Study Group 12—The Evolution of Telephonometric Testing Methodologies: The Use of Complex Signals", International Telecommunication Union, SG12 Workshop, Dakar, Oct. 2001, (pp. 1-17).

* cited by examiner

*Primary Examiner* — Thanh V Pham
(74) *Attorney, Agent, or Firm* — Blakely, Sokoloff, Taylor & Zafman LLP

(57) ABSTRACT

A handheld wireless communications device has an adjustable volume setting. The communications device also has a downlink audio processor containing a digital audio filter. Storage in the device contains a first set of filter coefficients that configure the filter to enable the device to pass a wireless communications device certification process while sacrificing sound quality, at a low volume setting. The storage also contains a second set of filter coefficients that configure the filter to enhance sound quality while sacrificing passing the wireless communications device certification process, at a high volume setting. Other embodiments are also described and claimed.

14 Claims, 5 Drawing Sheets

FILTER ADAPTATION BASED ON VOLUME SETTING FOR CERTIFICATION ENHANCEMENT IN A HANDHELD WIRELESS COMMUNICATIONS DEVICE

This application claims the benefit of the earlier filing date of U.S. provisional application Ser. No. 61/042,622, filed Apr. 4, 2008, entitled "Audio Signal Processing in a Handheld Wireless Communications Device".

This invention relates to handheld wireless communications devices that have a built-in processor for enhancing an audio signal.

BACKGROUND

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Handheld wireless communications devices often have several functions that involve digital audio signal processing. For example, consider their use as a mobile telephony device (e.g., a cellular telephone handset). Following a call set up or connection phase, a simultaneous two-way voice conversation between a local user of the device and another (remote) user in a telephone call may be enabled as follows.

A so-called uplink chain in the device is responsible for digitizing the local user's speech that has been detected by a built-in microphone. This may result in a raw digital audio signal or bit stream, e.g. a pulse code modulated, PCM, audio signal or bitstream. The uplink chain then digitally codes the raw signal, to remove its redundant content. For instance, a 64 kbits/sec raw speech bitstream may be encoded as a 14 kbits/sec bitstream, without causing a noticeable drop in sound quality. Next, the uplink chain modulates a RF carrier signal with the coded signal (and other information regarding the call). An antenna of the device is then driven with the modulated RF carrier. The local user's speech is thus transmitted to the cellular telephone network.

To enable the above-mentioned two-way conversation, a downlink chain is provided in the device, so that the local user can hear the remote user's speech. The downlink chain operates in parallel with or simultaneously as the uplink chain, to enable the real-time two-way conversation. The downlink chain may essentially perform the reverse of the uplink chain's operations. Thus, an antenna of the device outputs a downlink RF signal sent by the cellular telephone network. The downlink chain then demodulates the downlink RF signal to yield a so-called baseband signal. The latter contains a coded audio signal, which includes an encoded version of the captured speech of the remote user. The coded audio signal is decoded (e.g., into a PCM bitstream), converted to analog format and then played to the local user, through a receiver or speaker of the device. To render higher quality or better sound when an audio signal is played back, various signal processing operations may be performed on the digital audio signal in both the downlink and uplink chains. These may include noise filtering or noise suppression (sometimes referred to as noise cancellation), gain control, and echo cancellation.

Most handheld wireless communications devices are typically certified for use with a given cellular communications network. This may be in accordance with a specification that is governed by an approved authority such as the PCS Type Certification Review Board (PTCRB). The certification process entails the laboratory testing of a manufactured specimen of the device, to determine its compliance with the specification. For example, the audio portion of the specification for Global System for Mobile communications, GSM, devices requires that an artificial speech signal (or "cert signal") be sent over the air during a wireless call with the device. For the downlink portion of the test, the cert signal is received over the air by the device. The sound pressure level and spectrum of this cert signal as output by the device's receiver (earpiece speaker) is then measured, at a given volume or loudness setting of the device. For the uplink portion of the test, the cert signal is transmitted by the device over the air to a receiving test station where it is converted into sound. In order for the device to pass the certification test, the measured sound output (which is a function of frequency) needs to fall within a certain spectral and sound pressure level range (also referred to as a "mask") that is defined in the specification, for the duration of the signal (e.g., about twenty seconds).

SUMMARY

In accordance with an embodiment of the invention, a certification enhance filter is added to the downlink digital audio signal processing chain of a mobile audio communications device. The audio frequency response of the filter is automatically adapted or reconfigured, depending upon whether the user-controlled loudness or volume of the device is at a low (e.g., "nominal") setting or at a high (or "normal") setting. At the low setting, the digital filter is reconfigured such that its frequency response causes the spectral shape of sound output by a speaker of the device (e.g., the receiver), as driven by the downlink audio signal, to be in compliance with a wireless communications device certification spectral mask. This configuration of the filter may sacrifice sound quality when the device is being used in a typically noisier end-user scenario.

On the other hand, at the high volume setting, which is more likely to be the setting selected by a user in a typical, end-user scenario that has more ambient noise, the digital filter is automatically reconfigured such that its frequency response causes the spectral shape of sound output by the speaker (as driven by the downlink audio signal) to improve the end-user experience though perhaps sacrificing compliance with the certification mask.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Various embodiments of the invention, as methods and circuitry for audio signal processing to be used in a handheld wireless communications device for meeting certification requirements are now described in some detail, beginning with an overview of the electronic hardware and software components that make up an example wireless handheld communications device.

Overview

Figure 1:
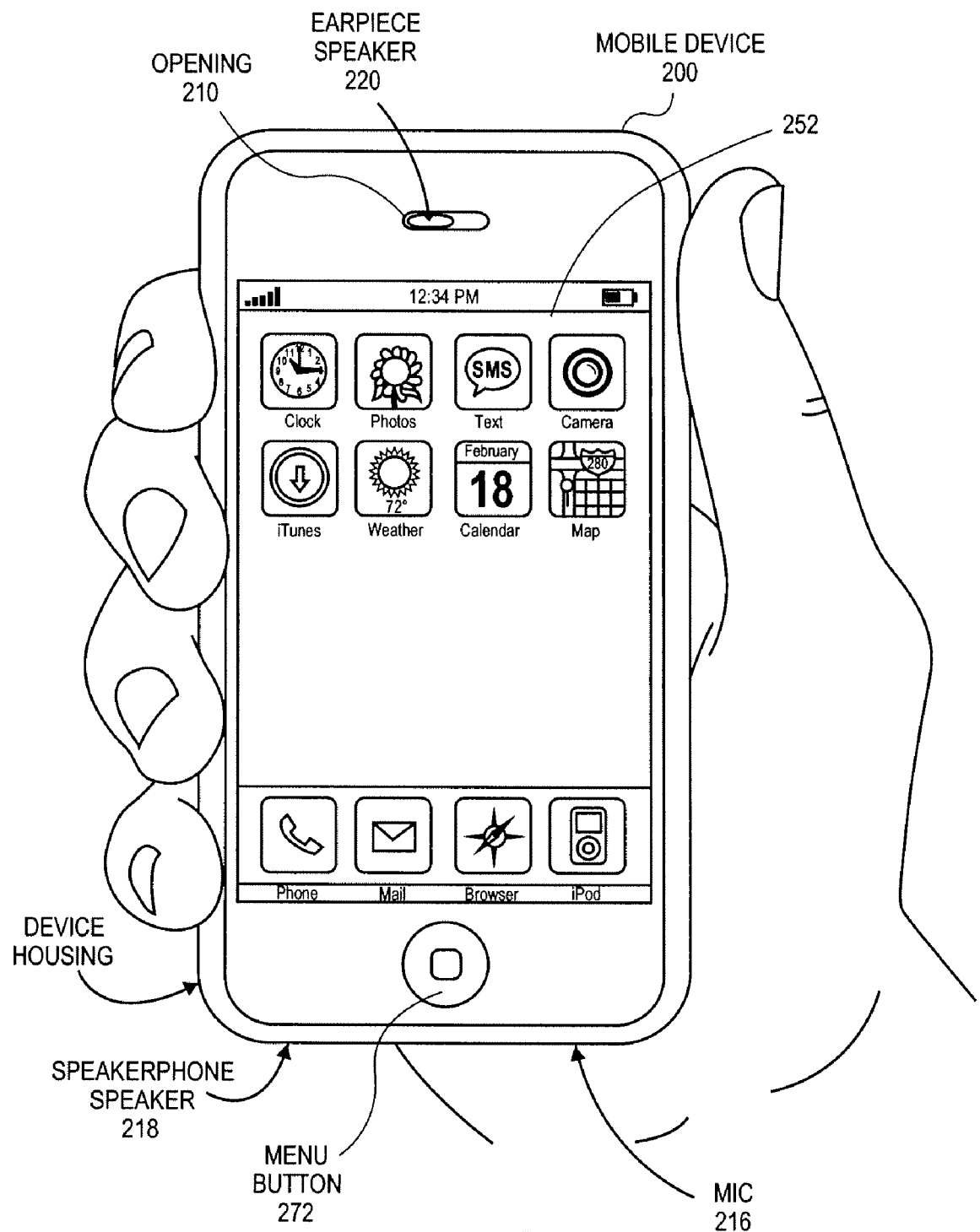
FIG. 1 is a perspective view of an example handheld wireless communications device in which the embodiments of the invention can be implemented.

FIG. 1 is a perspective view of an example handheld wireless communications device 200 in which the embodiments of the invention can be implemented. Note that the particular device 200 shown and described here is just an example—the concept of certification enhancement described further below may be implemented in other types of handheld wireless communications devices, e.g. ones that do not use a touch screen display, or ones that do not have a chocolate bar type housing.

The device 200 shown and described here has similarities to the iPhone™ device by Apple Inc. of Cupertino, Calif. Alternatively, it could be another portable or mobile, handheld multi-function electronic device or smart phone that has some or all of the certification enhancement functionality described below. The device 200 in this case has a fixed, single piece housing, sometimes described as a candy bar or chocolate bar type, in which the primary mechanism for visual and tactile interaction with the user is a touch sensitive display screen 252. An alternative to this type of mobile device is one that has a moveable, multi-piece housing such as a dam shell design or one with a sliding, physical key pad as used by other smart phone manufacturers. The touch screen 252, or in other cases a simple display screen, will display typical smart phone features, such as visual voicemail, web browsing, email functions, digital camera pictures, as well as others. The example in FIG. 1 shows the touch screen 252 displaying the home or main menu of a graphical user interface that allows a user of the device 200 to interact with various application programs that can run in the device 200. The home menu displays icons or graphical images that represent application programs, files, and their associated commands as shown. These may include windows, fields, dialog boxes, menus, virtual buttons, cursors, scrollbars, etc. The user can select from these graphical images or objects by touching the surface of the screen 252 with her finger, in response to which the associated application program will be launched.

The device 200 has a wireless telephony function that enables its user to receive and place audio and/or video calls. At the upper end of the housing, an opening 210 is formed through which downlink audio during a call is emitted from an earpiece speaker 220. At a bottom end portion of the device 200, a microphone 216 is located to pickup the near end user's speech, which is then transmitted in an uplink signal to the far end user, during the call. In some cases, the device 200 also has a speakerphone speaker 218 built into the device housing, which allows the user to conduct a call without having to hold the device 200 against her ear. A proximity sensor 254 (see also FIG. 2) may be integrated in the mobile device 200, so as to detect proximity of the touch screen 252 to the user's face or head, and thereby automatically disable input through the touch screen 252 during a handset mode call.

Figure 2:
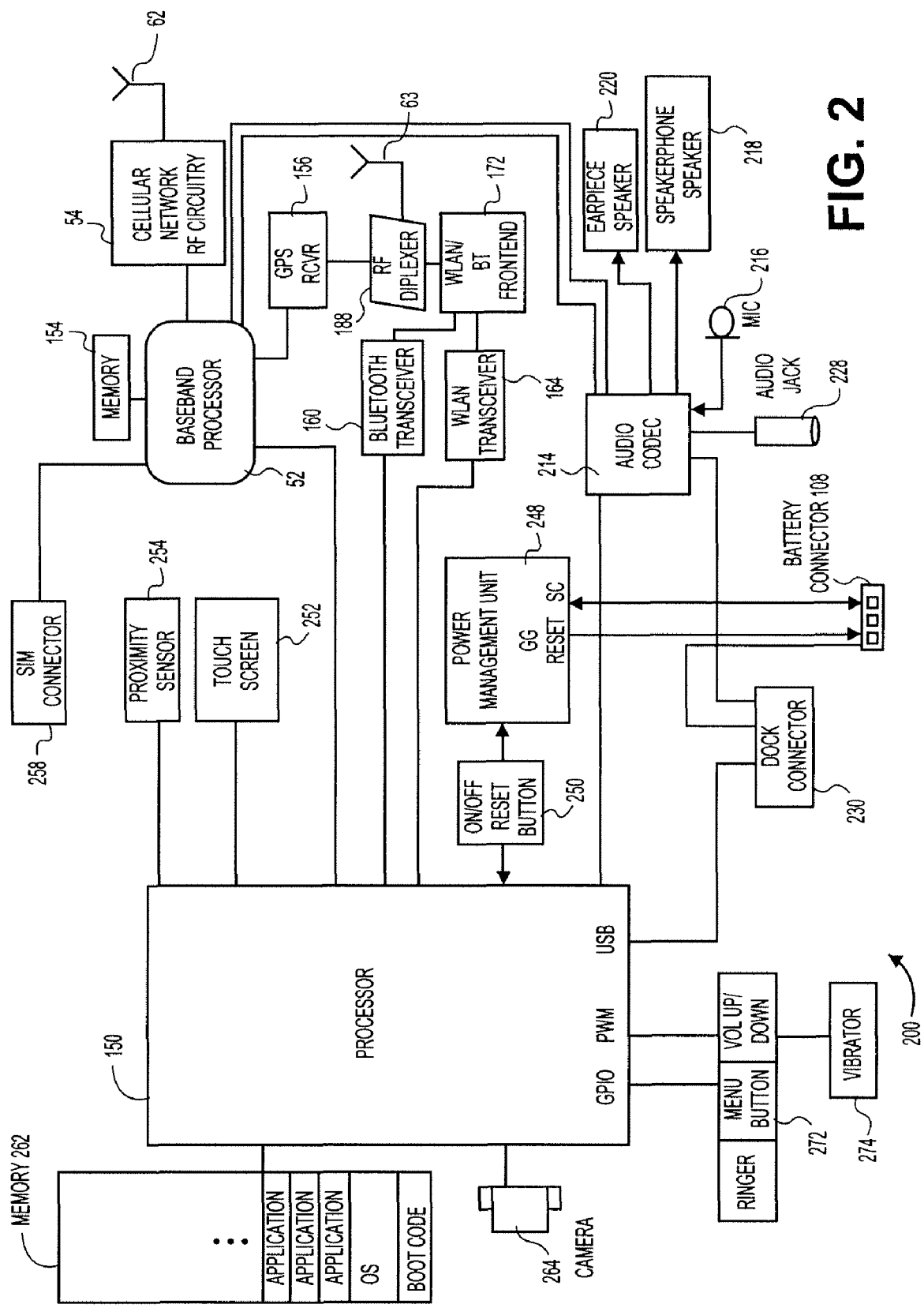
FIG. 2 is a block diagram showing internal circuit components of the example wireless handheld communications device of FIG. 1.

FIG. 2 is a block diagram of several internal circuit components of the example wireless handheld communications device 200, presented as an overview of the device 200. The device 200 has several built in electro-acoustic transducers including for example, a microphone 216, a receiver (ear speaker or earpiece) 220, and a loudspeaker (speakerphone) 218. The microphone 216 provides an output analog audio signal, whereas the receiver and speaker receive input analog audio signals. Collectively, these are referred to here as the analog acoustic transducer signals. An audio coder-decoder (codec) 214 acts as an interface to the analog input of the microphone and the analog outputs of the receiver and speaker, by providing any and all analog amplifiers and other analog signal conditioning circuitry that is needed for conditioning the analog acoustic transducer signals. The codec 214 may be a separate integrated circuit (IC) package.

In one example, the codec 214 operates in two modes. It can be configured into either mode, by control signals or programming supplied by an applications processor 150 over an I2C bus or other component bus. In one mode, referred to as media player mode, the device 200 is operating as a digital media player (e.g., an MP3 player that is playing back a music file stored in the device 100). In that mode, the codec 214 applies analog to digital and digital to analog conversion to the analog acoustic transducer signals to generate corresponding digital signals. In this mode, the codec 214 supplies the digitized microphone signal to an applications processor 150, and converts a digital audio signal from the applications processor 150 into analog form and then applies it to the receiver and/or speaker for play back.

In another mode, referred to as call mode, the device 200 is operating as a mobile telephony device (e.g., allowing its user to be in a real time audio conversation with another remote user during a cellular telephone call). In that mode the codec 24 acts as an analog pass through with no digital conversion, so that the analog acoustic transducer signals are passed through, with perhaps some analog amplification or buffering, between the baseband processor 52 and the acoustic transducers (signal line 152 outputs the microphone signal, while signal line 154 inputs the receiver or speaker signal).

The baseband processor 52 includes an interface to receive and transmit signals from and transmitted to a cellular network. The baseband processor, which may be a separate integrated circuit (IC) package, has an input port to receive a downlink signal, and an output port to transmit an uplink signal. These may be in a band around 26 MHz, for example, but alternatively they may be at other frequency bands that are considered intermediate (between baseband and RF at the antenna input). The downlink signal may be ready to be upconverted into a cellular network RF signal, such as a long range wireless communications signal that is directed to a cellular telephone network's base station, for example in a 3G or Universal Mobile Telecommunications System, UMTS, band, e.g. 850 MHz, 900 MHz, 1800 MHz, and 1900 MHz bands. Similarly, the uplink signal that is input to the baseband processor has been downcoverted from such an RF band, down to intermediate frequencies, e.g. 26 MHz band.

The uplink signal from the baseband processor may be upconverted into the antenna's radiation band, by a frequency upconverter that is external to the baseband processor IC package (e.g., as part of the RF transceiver IC package 54). For the downlink side, an RF down converter translates the downlink signal from the antenna's radiation band to a lower frequency suitable for input to the baseband processor. The signal at the input/output port of the baseband processor may be an intermediate frequency (IF) signal that is above the baseband frequencies but below the cellular network band frequencies (so called RF frequencies here). As an alternative, the RF up conversion and down conversion may be direct, from and to baseband, rather than going through an intermediate frequency.

The baseband processor may perform known cellular baseband processing tasks including cellular protocol signaling, coding and decoding, and signaling with the external RF transceiver. These together with the RF processing in the external RF transceiver may be referred to as the radio section of the device 200. The base band processor 52 may be programmable, in accordance with software that has been encoded and stored in its associated non-volatile memory 154. Permission to access the cellular network may be granted to the near end user in accordance with a subscriber identify module, SIM, card that is installed in the mobile device 200 to connect with the SIM connector 258.

The device 200 and the cellular network may be in agreement with respect to a particular voice coding (vocoding) scheme that is to be applied to the raw digital audio signal from the microphone (uplink signal) which is transmitted by the device 200. Similarly, an agreement is needed for the particular voice decode scheme which the device 200 should be applying to a downlink signal. Any known voice coding and decoding scheme that is suitable for the particular wireless communications protocol used may be adopted. The voice coding and decoding sections of the baseband processor may also be considered to be part of the radio section of the device 200.

The device 200 may also have further wireless communications capability, to provide a global positioning system, GPS, service, a Bluetooth link, and a TCP/IP link to a wireless local area network. To this end, a Bluetooth transceiver 160 is provided together with a wireless local area network, WLAN, transceiver 164, which provide additional wireless communication channels for the device 200. These two channels may share an antenna 63 for short range wireless communications (e.g., in accordance with a Bluetooth protocol and/or a wireless local area network protocol). An RF diplexer 188 has a pair of RF ports that are coupled to the antenna 63. One of the RF ports is used for GPS services, which a GPS receiver integrated circuit 156 uses to obtain GPS data that allows the mobile device 200 to locate itself to its user. The other RF port of the diplexer 188 is coupled to an RF front end 172 that combines Bluetooth and WLAN RF signals.

The cellular network, GPS, Bluetooth, and WLAN services may be managed by programming the applications processor 150 to communicate with the base band processor 52, Bluetooth transceiver 160, and wireless transceiver 164 through separate, component buses. Although not shown, there may also be separate component buses connecting the base band processor 52 to the Bluetooth transceiver 160 and WLAN transceiver 164, to enable the latter transceivers to take advantage of the audio processing engine available in the base band processor 52, to, for example, conduct a wireless voice over IP call (using the WLAN transceiver 164) and to allow the near end user to conduct the call through a wireless headset (using Bluetooth transceiver 160).

The so-called power hungry components of the mobile device 200 may include the base band processor 52, the applications processor 150, the touch screen 252, and the transmit RF power amplifiers that are part of the RF circuitry 54. These are coupled to be monitored by a power management unit 248. The power management unit 248 may monitor power consumption by individual components of the device 200 and may signal power management commands to one or more of the components as needed so as to conserve battery energy and control battery temperature.

Other lower level hardware and functionality of the mobile device 200 include an on/off or reset button 250, a vibrator 274 used to indicate the ringing signal of an incoming call, an audio ringer, a physical menu button, and a volume up/down button (collectively referred to as circuit elements 272 which may be coupled to output pins of the processor 150 as shown). The mobile device 200 may also have a dock connector 230 that communicates with a USB port of the processor 150, allowing the device 200 to, for example, synchronize certain files of the user with corresponding files that are stored in a desktop or notebook personal computer of the same user. The dock connector 230 may also be used to connect with a power adapter or other electricity source for charging the battery (via the battery connector 108).

In a further embodiment, the mobile device 200 may have digital camera circuitry and optics 264 that are coupled to the processor 250, enabling the mobile device to be used as a digital still or video camera.

Having described the lower level components of the mobile device 200, a brief discussion of the higher level software functionality of the device is in order. As suggested above, the device 200 may be essentially considered to be a computer whose processor 150 executes boot code and an operating system (OS) stored in the memory 262 within the device. Running on top of the operating system are several application programs or modules that, when executed by the processor 150, manage at a high level the following example functions: placing or receiving a call (phone module); retrieving and displaying email messages (mail module); browsing the web (browser module); and digital media playback (iPod™ player module). Additional applications or widgets may be executed by the processor 150, such as those depicted in FIG. 1, including a clock function, SMS or text messaging service application, a weather widget, a calendar application, a street map navigation application, and a music download service application (the iTunes™ service).

Audio Processing Capabilities

Figure 3:
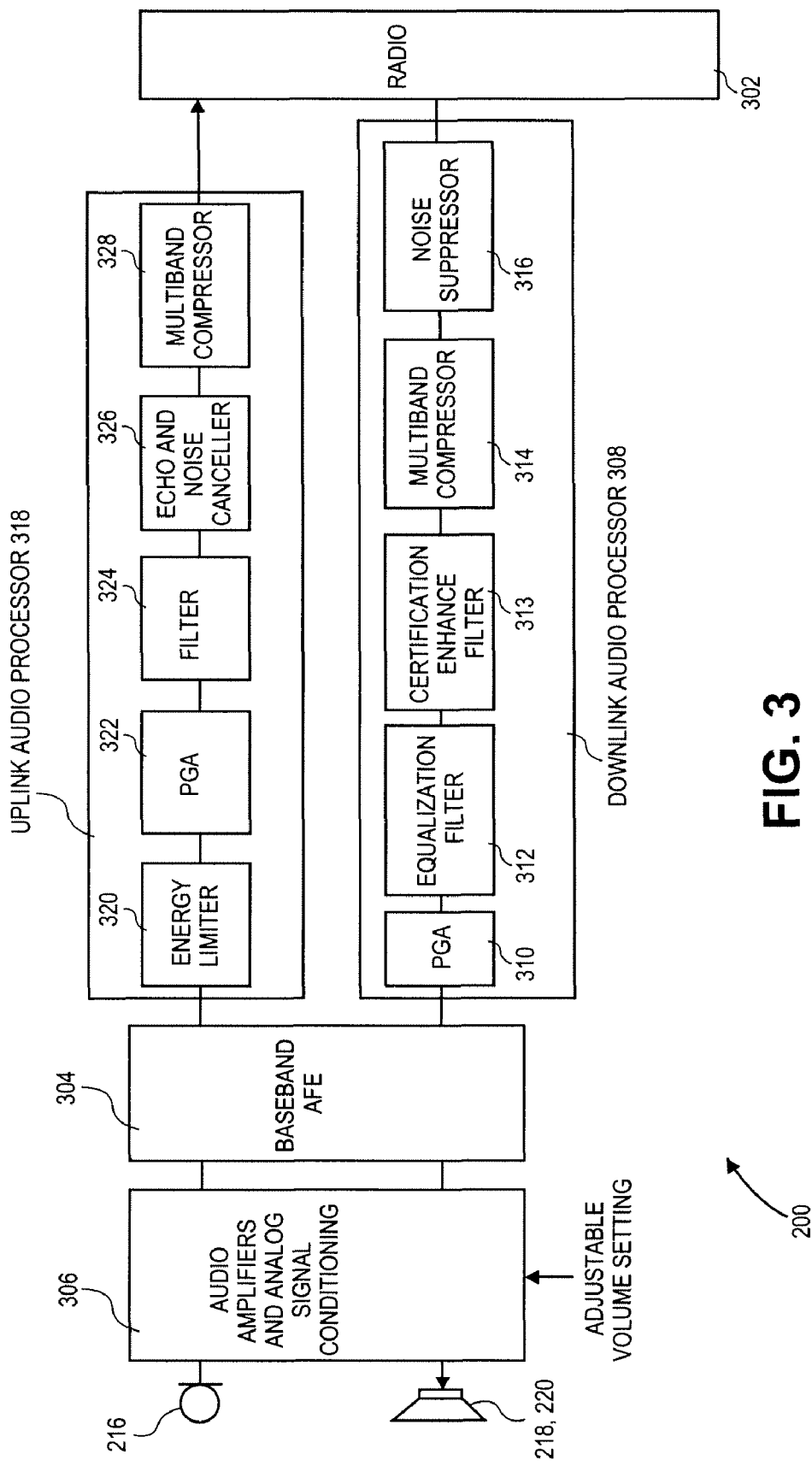
FIG. 3 depicts example uplink and downlink audio processors integrated in a wireless handheld communications device and that can be used to implement the certification enhancement features described here.

The device 200 has a digital audio signal processing structure between its radio section 302 (responsible for interfacing with the cellular phone network for example or a wireless local area network), and its baseband analog front end (BB AFE) 304, as depicted in FIG. 3. The AFE 304 interfaces with the acoustic transducers of the device 200, namely the microphone 216 and earpiece speaker 220, by performing the needed analog to digital, A/D, and digital to analog, D/A, conversion. A block of audio amplifiers and other analog audio signal conditioning circuitry 306 are part of the analog interface with the microphone 216 and speakers 218, 220, which generates a speaker driver signal whose strength is based on an adjustable volume setting received as input. The latter may be a digital signal set by the user's manual actuation of a volume up/down button of the device 200 (see FIG. 2, block 272). The digital signal processing structure includes a downlink signal processing chain or downlink audio processor 308 that has an input coupled to the radio section 302 and an output feeding the AFE 304. The input receives a decoded, digital or sampled voice signal or bit stream referred to as the downlink baseband or audio signal, from the radio section 302. The input signal may be in the form of a pulse code modulated bit stream. The downlink audio processor 308 may perform several digital signal processing operations upon this input signal in succession, in order to enhance the signal (before it is fed to the AFE 304). These may include a combination of one or more of the following operations performed on the downlink audio signal: adjust its gain using a downlink programmable gain amplifier (PGA) 310; apply equalization to it using a downlink equalization digital filter 312; perform multi-band audio compression upon it using a downlink multi-band compressor 314; and reduce noise using a noise suppressor 316. Not all of these operations are needed in the downlink chain—for example, the noise suppressor 316 may be omitted. In accordance with an embodiment of the invention, a certification enhance filter 313 is added to the downlink chain. As described below in greater detail, the frequency response of the certification enhance filter 313 is automatically adapted to have a different frequency response, depending on whether the user-configured (manually adjustable) volume setting of the device 200 is low or high.

The device 200 may also perform enhancement operations on an uplink audio signal. This is done using an uplink audio processor 318 that acts upon an uplink digital voice signal or bit stream received from the microphone 216 via the AFE 304 (prior to the voice coding of the signal for transmission). In the example of FIG. 3, the uplink audio processor 318 includes the following signal processing chain: an energy limiter 320, an uplink PGA 322; an uplink programmable digital filter 324; an echo and noise canceller 326 (including a noise suppressor block); and an uplink multi-band compressor 328. However, not all of these signal processing blocks may be needed in every instance.

The downlink audio processor 308 and the uplink audio processor 318 may each be implemented as a separate programmed processor, or a separate combination of a programmed processor and dedicated hardwired logic. Alternatively, the functions of the downlink and uplink chains may be performed by the combination of a single, programmable processor, e.g. such as one that is available in the baseband processor 52 (see FIG. 1). In either case, there is said to be a processor that executes stored or encoded program instructions (e.g., that are stored or encoded in external memory 154 of the baseband processor, see FIG. 2) to enhance a voice signal that is being passed through it for purposes of both certification testing and normal end-user scenarios, as follows.

Cellular/Wireless Protocol Certification Enhancement

In accordance with an embodiment of the invention, the uplink voice signal, the downlink voice signal, or both, can be enhanced for purposes of passing a certification test. Before describing the problem and its solution, some background on a typical certification test is provided.

In the downlink portion of certification testing of cellular phone handsets, a certification signal, which is an artificial speech signal that may last several seconds, is sent over the air to the device 200, becoming in effect the downlink audio signal. The characteristics of this cert signal including its duration and spectral content may be in accordance with an industry standard, e.g. the International Telecommunication Union telecommunication standardization sector's ITU-T. To test the device 200, the receiver (earpiece speaker) volume setting of the device is placed in a "nominal" setting, which is one that results in a required, received loudness reading, RLR, (measured typically in dB) from the device' receiver or earpiece speaker, while the received cert signal is being emitted from it. As an example, the nominal RLR may be 2 dB. The nominal volume setting for many types of devices 200 may be about the midpoint of the full volume range (between minimum and maximum) available from the device 200. Once the volume has been set to this nominal setting, the cert signal is sent to the device 200 and is immediately emitted by the device as sound from its receiver (earpiece speaker). The sound output by the device's receiver is measured at a given loudness setting, and may be plotted as a function of frequency. See for example FIG. 5 for a sketch of an example sound output plot, and an example spectral mask (e.g., a GSM mobile phone testing mask or other similar test criteria provided by the ITU-T, for example) that delineates the permissible boundary of the measured sound output. The measured sound output of the receiver, for the cert signal, should fall within or meet the defined spectral mask or envelope, over the entire required frequency range of the mask and for a given duration of the signal. Such a certification process may be one that is governed by the PCS Type Certification Review Board, PTCRB.

For the uplink portion of the certification test, the artificial speech signal is played to the microphone of the device 200. The signal is processed by the uplink audio processor 318 and then transmitted over the air, e.g. during a wireless call, to a testing destination. There, the signal is converted to sound, picked up by a test microphone, and then evaluated for compliance with a specified, Send Loudness Reading, SLR (by further test equipment).

The following problem might occur during certification testing of certain types of mobile devices 200. The downlink audio processor is configured to process the downlink signal so as to enhance sound from the receiver, during typical end-user scenarios that might contain increased noise levels (e.g., outdoors in an urban environment). However, when testing the device to determine if it complies with a certification spectral mask (where the device is receiving a cert signal in a laboratory setting), the receiver's output sound may fall outside the envelope of the spectral mask.

In accordance with an embodiment of the invention, the certification enhance filter 313 (see FIG. 3) is added to the downlink audio processor 308 and is automatically reconfigured to ensure compliance with the certification mask. The filter 313 may be for example, a 32-tap programmable finite impulse response, FIR, filter (or any suitable digital filter having preferably at least 32 taps, and preferably an FIR filter). This FIR filter may be in addition to the equalization filter 312 (see FIG. 3), which may be for example, a biquad infinite impulse response, IIR, filter that is used for equalization.

Figure 4:
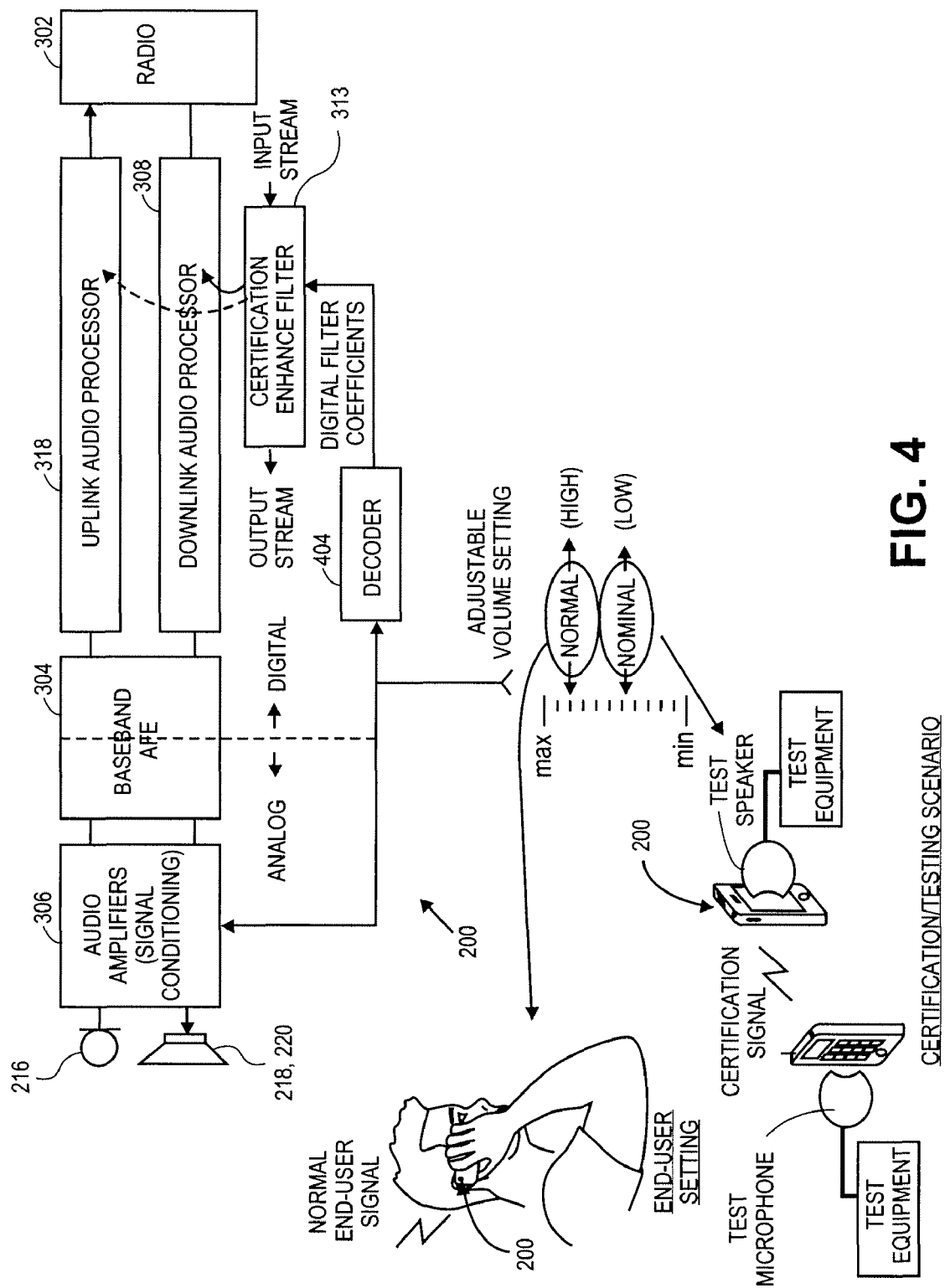
FIG. 4 depicts the audio processors of the device in the context of testing and end-user environments.

Referring now to FIG. 4, the cert enhance filter 313 is configured so that its frequency response (ratio of its output bitstream to its input bitstream), when the device 200 is operating as a cellular or wireless communications handset in the midst of a telephone call, causes the resulting shape of the measured sound output of the receiver of the device 200 to an artificial voice signal, at a "nominal" volume setting, to be in compliance with the certification protocol's spectral mask. The nominal volume setting is one that results in a required, received loudness reading, RLR, (in dB) at the speaker output, for the specified artificial voice signal. As an example, the nominal RLR may be 2 dB. In other words, when the volume setting of the device 10 is set to a nominal level, which might be about the midpoint of the full range available for example, and an artificial voice signal is being played by the device 200 through its receiver (pursuant to e.g., ITU-T Recommendation P.50), the sound output at the receiver of the device falls within or meets the GSM mask over the entire required frequency range.

Figure 5:
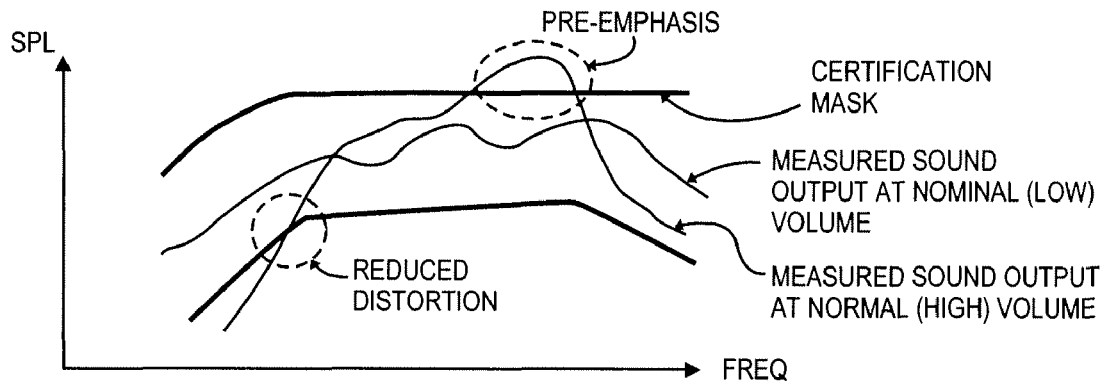
FIG. 5 shows example plots of expected, measured sound output (as sound pressure level, SPL, vs. frequency), overlayed with an example certification mask.

However, when the volume setting is changed to a substantially higher level than the nominal one (that was used for certification testing), a decoder 404 in the device 200 will respond by reprogramming the coefficients of the certification enhance filter 313 so that it exhibits a different, predetermined frequency response. The higher volume setting ("normal") is one that it is expected to be used by the customer or end user in a typical, end user environment in which the device 200 is conducting a telephone call, which is a much noisier ambient environment than that specified for testing the device to see if it meets the certification protocol requirements. With the filter's response reconfigured for such an environment, some of the mid to high frequency ranges (e.g., those in which consonant sounds, as opposed to vowel sounds, lie) may be boosted (e.g., greater pre-emphasis filtering action), while the very high frequency ranges and the very low ranges may be attenuated. In other words, and as indicated in FIG. 5, there can be pre-emphasis and perhaps more aggressive noise reduction in that filter response, which may cause the device 200 to violate the certification spectral mask. However, this results in the device 200 providing a better sound from its receiver or other speaker (e.g., loud speaker or speakerphone speaker), so that the end user can more easily hear and distinguish between "p" and "b", or between "f" and "s", even in the presence of relatively high noise levels that are presents in a typical end user environment.

As seen in FIG. 4, the "nominal" volume setting is one that yields the required RLR (specified in a cellular/wireless handset certification test protocol)—it is deemed low relative to the "normal" setting. In many instances, the nominal setting may be about half way in the full range of volume, but in other instances may be a little higher or lower depending on the characteristics of the receiver and the RLR required by the certification test.

In another embodiment of the invention, the decoder 404 can recognize more than two volume settings as inputs, and automatically translates each such input volume setting into its respective set of coefficients for the digital audio filter (that is the certification enhance filter 313). This may be done by the decoder 404 accessing a stored look up table (in the device 200) whose entries have several different volume setting ranges mapped to corresponding filter coefficient sets. These modifications to the filter 313 may be made not only in the cellular or telephony mode of operation described above (and its certification testing scenario), but also when the device 200 is operating in a media player mode (e.g., while playing a stored music or movie file). Additional granularity to such filter adaptation may also be provided, as described below in connection with FIG. 6.

Figure 6:
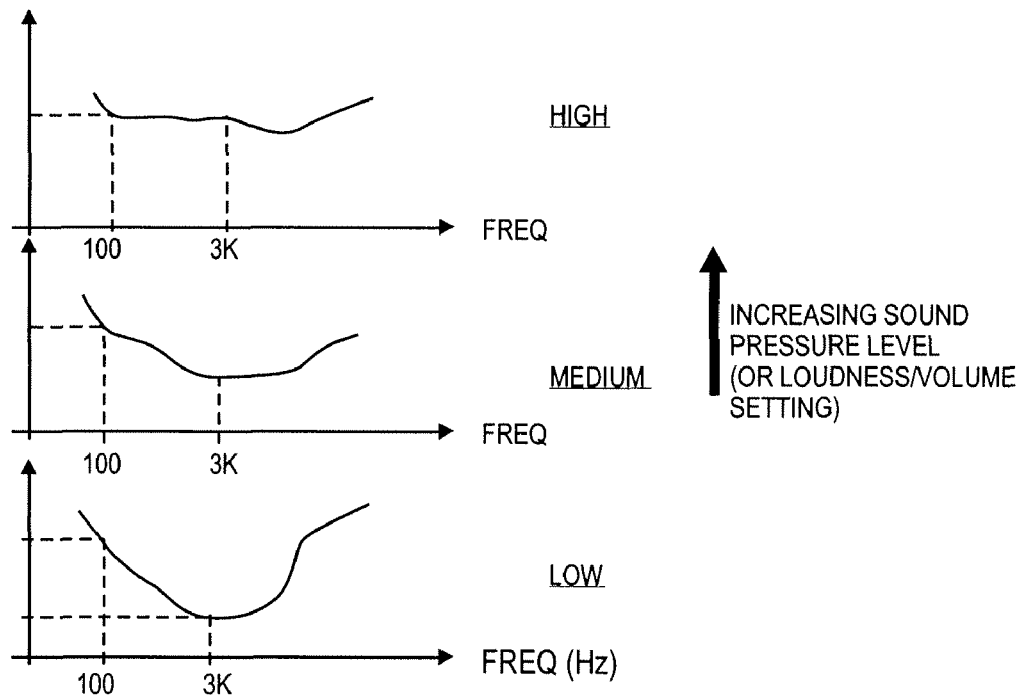
FIG. 6 shows example sound output spectra that can be produced by the wireless communications, as a function of different volume settings.

FIG. 6 illustrates three graphs of audio gain vs. frequency. Each graph shows the needed gain level to obtain the perception of equal loudness by the user's ear, as a function of frequency. In other words, for a user to hear 100 Hz at the same loudness level as 3 kHz, the 100 Hz signal coming into the user's ear has to be much louder than the 3 kHz signal. However, this disparity drops as the sound pressure level increases. In other words, at a high volume setting, the gain applied to the lower frequencies of a voice signal (to boost the lower frequencies so that the user can perceive or hear them to have similar loudness as the higher frequencies) is less than that applied at a lower volume setting.

In accordance with an embodiment of the invention, two or more digital filter configurations (or coefficient sets) are defined and stored in the device 200. Each set of filter coefficients is to provide gain to the input audio signal, in accordance with a respective one of the graphs in FIG. 6. When the volume setting is at a low level, the decoder 404 programs the filter's frequency response to follow the corresponding low setting graph. When the user increases the volume to a medium setting, the decoder 404 responds by reprogramming the filter frequency response to follow the corresponding, medium graph, and so on. The device 200 thus adapts the digital audio filter to its external volume level, which is manually set or changed by the user.

To conclude, various aspects of a technique for giving a developer and user of a communications device more convenient control of sound quality have been described. As explained above, an embodiment of the invention may be a machine-readable medium having stored or encoded thereon instructions which program a processor to perform some of the operations described above. In other embodiments, some of these operations, that of the decoder 404 depicted in FIG. 4, might be performed by specific hardware components that contain hardwired logic. Those operations might alternatively be performed by any combination of programmed data processing components and fixed hardware circuit components.

A machine-readable medium may include any mechanism for storing or transferring information in a form readable by a machine (e.g., a computer), such as Compact Disc Read-Only Memory (CD-ROMs), Read-Only Memory (ROMs), Random Access Memory (RAM), and Erasable Programmable Read-Only Memory (EPROM).

The invention is not limited to the specific embodiments described above. For example, the numerical values given in FIG. 6 may be different, depending on the acoustic characteristics of the speaker and its packaging in a particular device 200. Accordingly, other embodiments are within the scope of the claims.

What is claimed is:

1. A handheld wireless communications device having an adjustable volume setting, comprising:
   a speaker;
   storage to store a current, user-selected volume setting for driving the speaker;
   a downlink audio processor having a chain of digital signal processing, dsp, components to process a downlink audio signal that is to then drive the speaker, said chain of dsp components include a first digital filter and a second digital filter,
   the first digital filter to perform equalization upon the downlink audio signal unaffected by the stored volume setting,
   the second digital filter adapted to have a different frequency response depending on whether the stored volume setting is low or high,
   wherein when the second digital filter is configured according to the low volume setting, its frequency response causes the spectral shape of sound output by the speaker, as driven by the processed downlink audio signal when the volume setting is low, to be in compliance with a wireless communications device certification mask,
   and wherein when the second digital filter is configured according to the high volume setting, its frequency response causes the spectral shape of sound output by the speaker, as driven by the processed downlink audio signal when the volume setting is high, to not be in compliance with the wireless communications device certification mask.

2. The handheld wireless communications device of claim 1 wherein the speaker is a receiver or earpiece.

3. The handheld wireless communications device of claim 2 wherein the certification mask is a Global System Mobile, GSM, certification mask.

4. The handheld wireless communications device of claim 1 wherein the low volume setting is one that results in a receive loudness reading, RLR, defined by a wireless communications device certification process for an artificial voice signal.

5. The device of claim 1 wherein the first filter is an IIR filter and the second filter is a FIR filter.

6. A method for manufacturing a communications device having a user-adjustable volume setting, comprising:
storing a first set of filter coefficients in the device, wherein the first set configures a digital audio filter of the device to enable the device to pass a wireless communications device certification process while sacrificing sound quality at a low volume setting; and
storing a second set of filter coefficients in the device, wherein the second set configures the digital audio filter to enhance sound quality while sacrificing passing the wireless communications device certification process at a high volume setting.

7. The method of claim 6 wherein the wireless communications device certification process is a GSM cellular handset certification process.

8. The method of claim 6 wherein the second set of filter coefficients configures the digital audio filter to enhance sound quality by adding gain in a high frequency audio range and reducing gain in a low frequency audio range.

9. The method of claim 6 wherein the low volume setting is one that results in a receive loudness reading, RLR, defined by a wireless communications device certification process for an artificial voice signal.

10. An audio device comprising:
a speaker;
an audio processor having a filter chain of a first digital audio filter and a second digital audio filter, a frequency response of the second filter being defined by a set of filter coefficients, an output of the filter chain being coupled to an input of the speaker; and
a decoder to alternatively provide the second filter, and not the first filter, with first and second sets of filter coefficients, based on having decoded a user-adjustable volume setting for the device,
wherein the first set of coefficients configures the second digital audio filter to enable the device to pass a wireless communications device certification process while sacrificing sound quality from the speaker at a low volume setting, and
the second set of filter coefficients configures the second digital audio filter to enhance sound quality from the speaker while sacrificing passing the wireless communications device certification process at a high volume setting.

11. The communications device of claim 10 wherein the speaker is an earpiece speaker.

12. The communications device of claim 11 wherein at the low volume setting, the speaker is to output a receive loudness reading, RLR, defined by a communications device certification process.

13. The communications device of claim 12 wherein the RLR is defined by a GSM cellular device certification process.

14. The communications device of claim 13 wherein the first filter is an equalization filter.

* * * * *